United States Patent
Hotz et al.

(10) Patent No.: US 7,858,872 B2
(45) Date of Patent: Dec. 28, 2010

(54) BACK CONTACT FOR THIN FILM SOLAR CELLS

(75) Inventors: Charlie Hotz, Mountain View, CA (US); Puthur D. Paulson, San Jose, CA (US); Craig Leidholm, San Jose, CA (US); Damoder Reddy, Los Gatos, CA (US)

(73) Assignee: Solexant Corp., San Jose, CA (US)

( * ) Notice: Subject to any disclaimer, the term of this patent is extended or adjusted under 35 U.S.C. 154(b) by 0 days.

(21) Appl. No.: 12/381,637

(22) Filed: Mar. 13, 2009

(65) Prior Publication Data

US 2009/0235986 A1    Sep. 24, 2009

Related U.S. Application Data

(60) Provisional application No. 61/070,006, filed on Mar. 18, 2008, provisional application No. 61/069,952, filed on Mar. 18, 2008.

(51) Int. Cl.
*H01L 31/00* (2006.01)
(52) U.S. Cl. .............. 136/238; 136/260; 136/264; 136/265; 438/93; 438/95; 257/442
(58) Field of Classification Search .............. 136/260, 136/238, 264, 265; 438/93, 95; 257/442
See application file for complete search history.

(56) References Cited

U.S. PATENT DOCUMENTS

| 4,456,630 A | 6/1984 | Basol et al. |
| 4,568,792 A | 2/1986 | Mooney et al. |
| 5,472,910 A | 12/1995 | Johnson et al. |
| 5,557,146 A | 9/1996 | Britt et al. |
| 5,909,632 A | 6/1999 | Gessert |
| 6,537,845 B1 | 3/2003 | McCandless et al. |
| 7,220,321 B2 | 5/2007 | Barth et al. |
| 2004/0178426 A1 | 9/2004 | Melekhov et al. |
| 2004/0185672 A1 | 9/2004 | Polichar et al. |
| 2005/0186342 A1 | 8/2005 | Sager et al. |
| 2005/0224111 A1 | 10/2005 | Cunningham et al. |

(Continued)

FOREIGN PATENT DOCUMENTS

WO    WO 2004022637 A2    3/2004

OTHER PUBLICATIONS

Xi et al. Synthesis, Characterization and Growth Mechanism of Tellurium Nanotubes, Crystal Growth and Design, Vo. 5 No. 1. 2005, pp. 325-328, Pub. Sep. 2004.*

(Continued)

*Primary Examiner*—Jeffrey T Barton
*Assistant Examiner*—Devina Pillay
(74) *Attorney, Agent, or Firm*—Nold Intellectual Property Law; Charles R. Nold

(57) ABSTRACT

The present invention discloses thin film photovoltaic devices comprising Group II-VI semiconductor layers with a substrate configuration having an interface layer between the back electrode and the absorber layer capable of creating an ohmic contact in the device.

The present invention discloses thin film photovoltaic devices comprising Group II-VI semiconductor layers with a superstrate configuration having an interface layer between the back electrode and the absorber layer capable of creating an ohmic contact in the device where the interface layer comprises nanoparticles or nanoparticles that are sintered.

20 Claims, 6 Drawing Sheets

U.S. PATENT DOCUMENTS

| | | |
|---|---|---|
| 2006/0060237 A1 | 3/2006 | Leidholm et al. |
| 2007/0126079 A1* | 6/2007 | Shioya et al. ............... 257/532 |
| 2007/0163383 A1 | 7/2007 | Van Duren et al. |
| 2007/0169811 A1 | 7/2007 | Van Duren et al. |
| 2007/0175507 A1* | 8/2007 | Dutta ........................ 136/255 |
| 2007/0194694 A1 | 8/2007 | Reddy |
| 2008/0223430 A1 | 9/2008 | Krasnov et al. |
| 2008/0308148 A1 | 12/2008 | Leidholm et al. |
| 2009/0235983 A1 | 9/2009 | Girt et al. |

OTHER PUBLICATIONS

Chopra, Thin Film Solar Cells: An Overview, Prog. Photovoltaic: Research and Applications 2004: 12 pp. 69-92, Pub: Dec. 2004.*

Studies of ZnTe Back Contacts to CdS/CdTe Solar Cells Gessert, T.A. et al., Presented at the 26th IEEE Photovoltaic Specialists Conference, Sep. 29B. Oct. 1997.

Devel, of Cu-doped ZnTe for CdS/CdTe solar cells. Gessert, T.A. et al.; J. of Vacuum Science & Technology A: Vaccum, Surfaces, and Films May 1996. V.14, I:3, pp. 806-812.

Zhong et al, Alloyed $Zn_xCd_{1-x}S$ nanocrystals with highly narrow luminescence spectral width, J. Am. Chem. Soc. 125 (2003) 13559-13563.

Nie, S.M. et al.; Alloyed semiconductor quantum dots: tuning the optical properties without changing the particle size, J. Am. Chem. Soc. 125 (2003) 7100-7106.

A Novel Chemical Route to ZnTe Semiconductor Nanorods; Li, Yadong et al. Advanced Materials 11(10), pp. 847-850 (1999).

Cation Exchange Reactions in Ionic Nanocrystals; Alivisatos et al. Science Nov. 5, 2004, vol. 306, No. 5698, pp. 1009-1012.

Type-II Quantum Dots: . . . Heterostructures; Bawendi et al. J. Am. Chem. Soc., 2003, 125 (38), 11466-11467.

Singh et al., Thin film CdTe-CdS heterojunction solar cells on lightweight metal substrates, Solar Energy Materials and Solar Cells, 59 (1999) 145-161.

Singh et al., Design issues in the garication of CdS-CdTe solar cells on molybdenum foil substrates, Solar Energy Materials and Solar Cells 76 (2003) 369-385.

Chavez et al., Evaporated cadmium telluride film on steel foil substrates, Journal of Materials Science: Materials in Electronics 6 (1995) 21-24.

Matulionis et al., Cadmium Telluride Solar Cells on Molybdenum Substrates, Mat. Res. Soc. Symp. Proc. vol. 668 (2001).

* cited by examiner

BACK CONTACT FOR THIN FILM SOLAR CELLS

CROSS REFERENCE TO RELATED APPLICATIONS

This application claims priority to U.S. Provisional Patent Application Ser. No. 61/070,006 filed Mar. 18, 2008 and U.S. Provisional Patent Application Ser. No. 61/069,952 filed Mar. 18, 2008, the contents of both applications are hereby incorporated herein by reference.

BACKGROUND OF THE INVENTION

Increasing oil prices have heightened the importance of developing cost effective renewable energy. Significant efforts are underway around the world to develop cost effective solar cells to harvest solar energy. In order for solar cells to be cost effective with traditional sources of energy solar cells must be manufactured at a cost well below $1/watt.

Current solar energy technologies can be broadly categorized as crystalline silicon and thin film technologies. Approximately 90% of the solar cells are made from silicon—single crystal silicon or polycrystalline silicon. Crystalline silicon (c-Si) has been used as the light-absorbing semiconductor in most solar cells, even though it is a relatively poor absorber of light and requires a considerable thickness (several hundred microns) of material. Nevertheless, it has proved convenient because it yields stable solar modules with good efficiencies (13-18%, half to two-thirds of the theoretical maximum) and uses process technology developed from the knowledge base of the microelectronics industry. Silicon solar cells are very expensive with manufacturing cost above $3.50/watt. Manufacturing is mature and not amenable for cost reduction.

Second generation solar cell technology is based on thin films. Main thin film technologies are amorphous Silicon, Copper Indium Gallium Selenide (CIGS), and Cadmium Telluride (CdTe).

Amorphous silicon (a-Si) was viewed as the "only" thin film PV material in the 1980s. But by the end of that decade, and in the early 1990s, it was written off by many observers for its low efficiencies and instability. However, amorphous silicon technology has made good progress toward developing a very sophisticated solution to these problems: multi-junction configurations. Now, commercial, multijunction a-Si modules in the 7-9% efficiency range are being produced by several companies. A number of companies such as Kaneka, Sharp, Schott Solar, Ersol, etc., are manufacturing amorphous silicon solar cells on glass substrates by adopting commercially proven CVD process to deposit a-Si originally developed for flat panel display manufacturing. Equipment companies such as Applied Materials are offering turn-key systems to manufacture a-Si solar cells on glass substrates. The key obstacles to a-Si technology are low efficiencies, light-induced efficiency degradation (which requires more complicated cell designs such as multiple junctions), and process costs (fabrication methods are vacuum-based and fairly slow). United Solar has pioneered triple junction a-Si solar cells on flexible stainless steel substrates. However, a-Si solar cells are expensive to manufacture (>$2.5/watt).

Thin film solar cells made from Copper Indium Gallium Diselenide (CIGS) absorbers show promise in achieving high conversion efficiencies of 10-12%. The record high efficiency of CIGS solar cells (19.9% NREL) is by far the highest compared with those achieved by other thin film technologies. These record breaking small area devices have been fabricated using vacuum evaporation techniques which are capital intensive and quite costly. A number of companies (Honda, Showa Shell, Wurth Solar, Nanosolar, Miasole etc.) are developing CIGS solar cells on glass substrates and flexible substrates. However, it is very challenging to fabricate CIGS thin films of uniform composition on large area substrates. This limitation also affects the process yield, which are generally quite low. Because of these limitations, implementation of evaporation techniques has not been successful for large-scale, low-cost commercial production of CIGS solar cells. It is extremely unlikely that CIGS solar cells can be produced below $1/watt manufacturing cost.

CdTe thin film solar cells are very simple to make and have the potential to achieve lowest manufacturing cost compared to all other solar cell technologies. CdTe solar cells with 16.5% efficiency have been demonstrated by NREL. First Solar based in Arizona is producing CdTe solar cells on glass substrates at a manufacturing cost of $1.12/watt. First Solar expects to reduce the cost to below $1/watt by the end of 2009 when it ramps up its annual manufacturing capacity to 1 GW. Further reduction in manufacturing cost of CdTe solar cells is not readily achievable because of relatively slow piece by piece manufacturing process.

The prior art makes CdTe solar cells by depositing CdTe on 3 mm thick glass substrates and encapsulated with a second 3 mm cover glass. Hence they are produced by a slow piece by piece manufacturing process. Further reduction in manufacturing cost of CdTe solar cells to well below $1/watt is not readily achievable because of slow piece by piece manufacturing process. These CdTe solar cells are also very heavy and cannot be used for residential rooftop applications—one of the largest market segments of solar industry. Opportunity exists to innovate by developing CdTe solar cell on flexible substrate that can be manufactured by a continuous roll to roll process to significantly reduce manufacturing cost. Flexible solar cells will also be light weight making them suitable for residential roof top applications which are not accessible to CdTe on heavy glass substrates.

Conventionally CdTe solar cells are manufactured in a superstrate configuration with transparent substrates such as glass substrates. Substrate configuration is required when opaque substrates such as flexible metal foil substrates are used for high volume production of CdTe devices. This change in device configuration necessitates a substantial deviation from the conventional back contact formation.

To improve electrical contact between CdTe and the electrode material in superstrate CdTe solar cells, a film of ZnTe has been deposited on CdTe using traditional physical vapor deposition means, Studies of ZnTe Back Contacts to CdS/CdTe Solar Cells T. A. Gessert, P. Sheldon, X. Li, D. Dunlavy, D. Niles, R. Sasala, S. Albright and B. Zadler. *Presented at the 26th IEEE Photovoltaic Specialists Conference, September 29B. October* 1997, the contents of which are incorporated herein by reference in its entirety.

Another solution to improving the contact between CdTe compounds and various electrode materials in superstrate devices is by depositing copper-doped ZnTe onto CdTe, see *"Development of Cu-doped ZnTe as a back-contact interface layer for thin-film CdS/CdTe solar cells."* T. A. Gessert, A. R. Mason, P. Sheldon, A. B. Swartzlander, D. Niles, and T. J. Coutts. Journal of Vacuum Science & Technology A: Vacuum, Surfaces, and Films May 1996 Volume 14, Issue 3, pp. 806-812, the contents of which are hereby incorporated by reference in its entirety.

The difficulty in providing ohmic contacts to Group II-VI semiconductor absorber films is due to its high work function as there are no metals available with work function higher than CdTe. In the prior art this problem is circumvented by forming pseudo-ohmic contacts which requires treating a Group II-VI semiconductor surface with various chemical etchants. Chemical etching methods are difficult to control and if uncontrolled have the potential to etch grain boundaries of the absorber semiconductor which can reduce the efficiency of the solar cells. In a substrate configuration solar cell, a thin layer cannot be created by the prior art treatment of Group II-VI semiconductor compound layer surfaces, since the Group II-VI semiconductor compound layer is deposited after the metal deposition and not accessible for such treatment. Accordingly there is a need for an improved solar cell having increased efficiency due to the improved ohmic contact between the absorber layer and the metal electrode layer.

SUMMARY OF THE INVENTION

In one embodiment the present invention disclose a photovoltaic device having a substrate configuration comprising a substrate, said substrate being transparent or opaque, a metal electrode layer, a transparent conductor layer, an absorber layer, said absorber layer comprising a Group II-VI semiconductor compound, a window layer, and an interface layer, wherein the interface layer is disposed between the metal electrode layer and the absorber layer such that an ohmic contact is created between the metal electrode layer and the absorber layer. In a preferred embodiment the absorber layer comprises a CdTe semiconductor and the window layer comprises a CdS semiconductor. The interface layer comprises a material selected from the group consisting of nanoparticles, nanoparticles that are sintered and a thin film. In one embodiment the nanoparticles, nanoparticles that are sintered and a thin film comprise a material selected from the group consisting of Group II-IV compounds, Group IV-VI compounds, Group IV compounds, Group III-V compounds and Group I-III-VI compounds. In a more preferred embodiment the nanoparticles, nanoparticles that are sintered and a thin film each independently comprise a material selected from the group consisting of $Cu_xTe$ where $1 \leq x \leq 2$, ZnTe, p doped ZnTe, $Cd_xTe_y$ where $x \neq y$, Cu doped CdTe, CdZnTe, $Sb_2Te_3$, $Bi_2Te_3$ and Te metal. In one embodiment the interface layer comprises a plurality of layers, said plurality of layers comprising a first layer comprising p-doped ZnTe nanoparticles, and a second layer comprising ZnTe nanoparticles.

In another embodiment the interface layer further comprises a third layer comprising Te metal nanoparticles disposed between the second layer comprising ZnTe nanoparticles and the absorber layer.

In another embodiment the plurality of layers comprises a first layer comprising $Cu_xTe$ where $1 \leq x \leq 2$ nanoparticles and a second layer comprising ZnTe nanoparticles. In this embodiment there may also be an interface layer comprising a third layer disposed between the second layer and the absorber layer, said third layer comprising a material selected from the group consisting of Te metal nanoparticles, $Cd_xTe_y$ where $x \neq y$ nanoparticles, and CdZnTe nanoparticles.

In another embodiment the interface layer comprises at least three layers, wherein a first interface layer comprises $Cd_{1-x}Zn_xTe$ nanoparticles where x=0, a second interface layer comprises $Cd_{1-x}Zn_xTe$ nanoparticles that are sintered where x=1, and a third interface layer in between the first and second interface layer said layer comprising $Cd_{1-x}Zn_xTe$ nanoparticles that are sintered where $0 \leq x \leq 1$.

In another embodiment the interface layer comprises a plurality of layers; said plurality of layers comprises a first layer comprising p-doped ZnTe nanoparticles that are sintered and a second layer comprising ZnTe nanoparticles that are sintered. In another embodiment the interface layer further comprises a third layer comprising Te metal nanoparticles that are sintered disposed between the second layer comprising ZnTe nanoparticles that are sintered and the absorber layer. In another embodiment the interface layer comprises a plurality of layers, and the plurality of layers comprises a first layer comprising $Cu_xTe$ where $1 \leq x \leq 2$ nanoparticles that are sintered and a second layer comprising ZnTe nanoparticles that are sintered. Further, the interface layer may comprises a third layer disposed between the second layer and the absorber layer, said third layer comprises a material selected from the group consisting of Te metal nanoparticles that are sintered, $Cd_xTe_y$ where $x \neq y$ nanoparticles that are sintered, and CdZnTe nanoparticles that are sintered.

In another embodiment the interface layer comprises at least three layers, wherein a first interface layer comprises $Cd_{1-x}Zn_xTe$ nanoparticles that are sintered where x=0, a second interface layer comprises $Cd_{1-x}Zn_xTe$ nanoparticles that are sintered where x=1, and a third interface layer in between the first and second interface layer said layer comprising $Cd_{1-x}Zn_xTe$ nanoparticles that are sintered where $0 \leq x \leq 1$.

In another embodiment the interface layer comprises a plurality of layers, said plurality of layers comprises a first layer comprising a p-doped ZnTe thin film, and a second layer comprising a ZnTe thin film. In another embodiment the interface layer further comprises a third layer comprising a Te metal thin film disposed between the second layer comprising a ZnTe thin film and the absorber layer. In another embodiment there is a plurality of layers comprising a first layer comprising a $Cu_xTe$ where $1 \leq x \leq 2$ thin film, and a second layer comprising a ZnTe thin film. In another embodiment the interface layer further comprises a third layer disposed between the second layer and the absorber layer, and said third layer comprises a material selected from the group consisting of a Te metal thin film, a $Cd_xTe_y$ where $x \neq y$ thin film, and a CdZnTe thin film.

In another embodiment the interface layer comprises at least three layers, wherein a first interface layer comprises a $Cd_{1-x}Zn_xTe$ thin film where x=0, a second interface layer comprises a $Cd_{1-x}Zn_xTe$ thin film where x=1, and a third interface layer in between the first and second interface layer said layer comprising a $Cd_{1-x}Zn_xTe$ thin film where $0<x<1$.

In another embodiment there is disclosed a photovoltaic device having a superstrate configuration comprising a transparent substrate, a TCO layer, a window layer, an absorber layer, an interface layer comprising nanoparticles or nanoparticles that have been sintered, and an electrode. In one embodiment the nanoparticles or nanoparticles that are sintered independently comprise a material chosen from the group consisting of $Cu_xTe$ where $1 \leq x \leq 2$, ZnTe, p doped ZnTe, $Cd_xTe_y$ where $x \neq y$, Cu doped CdTe, CdZnTe, $Sb_2Te_3$, $Bi_2Te_3$ and Te metal.

DETAILED DESCRIPTION OF THE EMBODIMENTS

Figure 1:
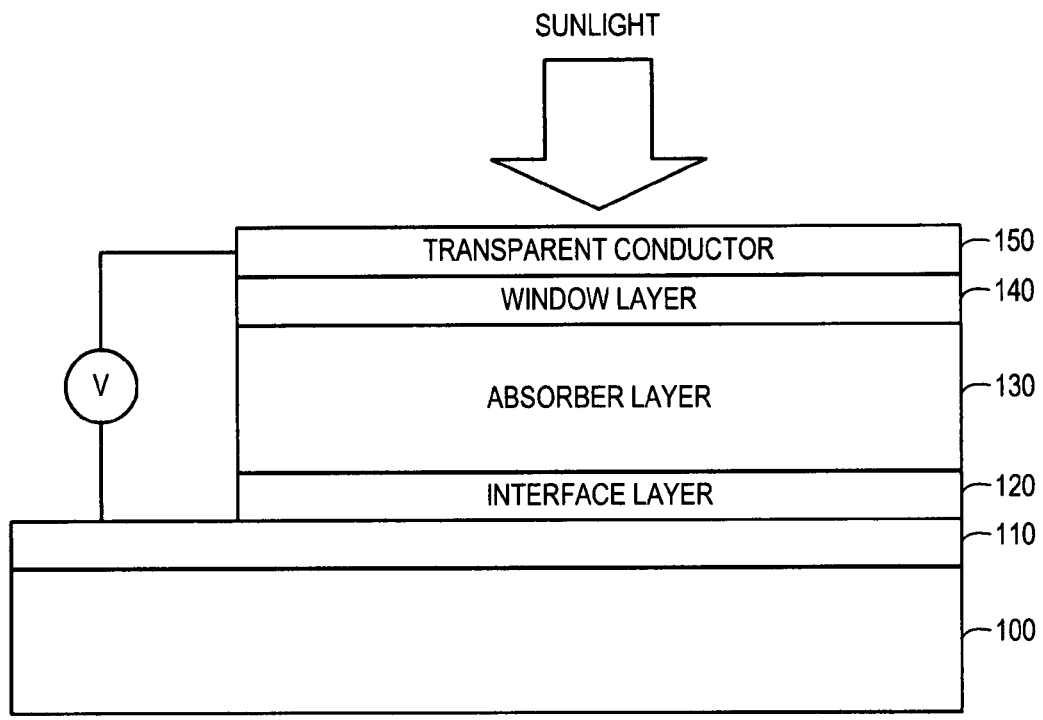
FIG. 1 shows a general schematic of a side view of one embodiment of the invention depicting a substrate solar cell with ohmic contact interface layer

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

"Ohmic contact layer" and "Interface layer" as used herein is meant to include a layer or plurality of layers that is located between the metal electrode and absorber layer. Thus by definition an "interface layer" includes a single layer as well as a set of multiple layers which may be 1, 2, 3, 4, 5 or more layers. The "interface layer" has been prepared so that the current voltage (I-V) curve of the device is substantially linear and symmetric. If the I-V characteristic is substantially non-linear and asymmetric, the layer can instead be termed a blocking or Schottky contact. Each layer or layers may independently comprise a thin film, nanoparticles, sintered nanoparticles or a combination of one or more of the three. Also, the invention contemplates that a plurality of ohmic contact layers comprising nanoparticles of different chemical compositions can be sequentially deposited.

As used herein the metal electrode is also referred top as a "back contact" or "electrode".

By "photovoltaic device" as used herein it is meant a multilayered structure having the least amount of layers necessary where in a working environment with proper leads and connections is capable of converting light into electricity. In one embodiment the device contains at least the following layers in order: a substrate/electrode layer/interface layer/absorber layer/window layer and a TCO layer and this structure is known in the art as a "substrate configuration". In another embodiment the photovoltaic device has a "superstrate configuration" and the device has at least the following layers in order: substrate/TCO/Window layer/absorber layer/interface layer/electrode layer.

In a substrate configuration the substrate may be transparent or opaque. In a preferred embodiment the substrate comprises a metal and is opaque. The device may have any further structure necessary to practically utilize the device such as leads, connections, etc. The above preferred embodiments of the present invention do not limit the order of layers or deposition order of the photovoltaic device.

Nanoparticles or sintered nanoparticles useful in the present invention comprise compound semiconductors which include Group I-VI, II-VI, III-V and IV-VI compounds and Group IV semiconductors. This also includes I-III-VI compounds such as CIGS. CIGS is $CuIn_xGa_{1-x}Se$, where $0 \leq x \leq 1$ and included herein is the family of materials known in the art as CIGS including CIS, CISe, CIGSe, CIGSSe. Spherical nanoparticles used herein have a size between about 1-100 nm, preferably between about 2-20 nm. It is understood that the instant invention contemplates that "nanoparticles" as used herein is not limited to spherical or substantially spherical particles but includes various shaped nanostructures such as tetrapods, bentrod, nanowires, nanorods, particles, hollow particles, single materials, alloyed materials, homogeneous and heterogeneous materials. The size of the nanoparticles is variable but it is preferred that if the particle is an elongate structure, i.e. a nanorod, that the length of the nanorod have a maximum length of about 100 nm and have a maximum diameter of about 1-20 nm, preferably about 5 nm.

Nanoparticles or sintered nanoparticles according to the instant invention may have a core or core/shell or core/shell/shell, or core/shell/shell/shell construction. The core and/or the shell can be a semiconductor material including, but not limited to, those of the Group II-VI (ZnS, ZnSe, ZnTe, CdS, CdSe, CdTe, HgS, HgSe, HgTe, MgTe and the like) and III-V (GaN, GaP, GaAs, GaSb, InN, InP, InAs, InSb, AlAs, AlP, AlSb, AlS, and the like), Group IV-V compounds, and IV (Ge, Si) materials, and an alloy thereof, or a mixture thereof. Type II heterostructures (see S. Kim, B. Fisher, H. J. Eisler, M. Bawendi, Type-II quantum dots: CdTe/CdSe(core/shell) and CdSe/ZnTe(core/shell) heterostructures, J. Am. Chem. Soc. 125 (2003)11466-11467, the contents of which are incorporated herein by reference) and alloyed quantum dots (X. H. Zhong, Y. Y. Feng, W. Knoll, M. Y. Han, Alloyed $Zn_xCd_{1-x}S$ nanocrystals with highly narrow luminescence spectral width, J. Am. Chem. Soc. 125 (2003) 13559-13563 and R. E. Bailey, S. M. Nie, Alloyed semiconductor quantum dots: tuning the optical properties without changing the particle size, J. Am. Chem. Soc. 125 (2003) 7100-7106, the contents of both are incorporated herein by reference) are considered suitable. The nanoparticles or sintered nanoparticles may have coatings or ligands attached thereto. Most of the materials listed above are quantum confined. But the invention does not require that the nanoparticles be quantum confined.

The invention contemplates that the nanoparticles used herein may be sintered or unsintered. In one embodiment of the present invention the nanoparticles are sintered or partially sintered during manufacturing and thus and the device comprises "sintered nanoparticles" or "nanoparticles that are sintered". Techniques and instruments for measuring the size of nanoparticles, sintered or partially sintered nanoparticles are known in the art. One of ordinary skill in the art will appreciate that the sintering process will alter the morphology, size and shape of the nanoparticles. Nanoparticle interface layers according to this invention can be thermally processed (in air, inert or reducing atmosphere or vacuum) to improve their electrical properties. Other sintering methods include laser, rapid thermal processing, flash annealing and similar techniques.

The present invention discloses the use of interface layers comprising either thin films, nanoparticles and/or nanoparticles that are sintered to achieve ohmic contact between a Group II-VI semiconductor absorber layer(s) and a back metal electrode in a photovoltaic device having a substrate configuration. The present invention also discloses the use of interface layers comprising nanoparticles and/or nanoparticles that are sintered to achieve ohmic contact between a Group II-VI semiconductor absorber layer(s) and a back metal electrode in a photovoltaic device having a superstrate configuration. In one embodiment $Cu_xTe$ where $1 \leq x \leq 2$, ZnTe, p doped ZnTe, $Cd_xTe_y$ where $x \neq y$, Cu doped CdTe, CdZnTe, $Sb_2Te_3$, $Bi_2Te_3$ and Te metal can be used in the interface layer or layers to achieve ohmic back contact between a Group II-VI semiconductor absorber layer and back metal layer. It is preferred that $Cd_xTe_y$ where $x \neq y$ be a compound where $y>x$ thus having a tellurium rich CdTe compound. Where the specification recites Cd(n)Te(>n) this means a tellurium rich CdTe compound. Where the specification recites "p-doped ZnTe:Cu" this means that the dopant is Cu.

The absorber layer according to the present invention comprises a Group II-VI semiconductor compound, preferably a Te containing Group II-VI semiconductor compound, more preferably CdTe. The absorber layer may comprise one layer or a plurality layers. The absorber layer(s) may comprise a thin film or nanoparticles or both.

In one embodiment of the present invention tellurium rich cadmium telluride nanoparticles can be prepared by using colloidal nanoparticle synthetic methods well known in the art and deposited as an interface layer according to one embodiment of the present invention. Tellurium rich $Cd_xTe_y$ where $y>x$ nanoparticles can be deposited before depositing a CdTe layer in a substrate configuration to achieve ohmic contact between CdTe and the back metal electrode. The prior art teaches a superstrate configuration creation of a tellurium rich thin layer on the electrode side of the absorber layer that improves electrical contact between the electrode and the Group II-VI semiconductor layer. This is accomplished by etching the surface of the absorber layer with an acid (either a mixture of nitric and phosphoric acids or a solution of bromine in methanol), or aniline. This is believed to selectively remove the Group II compound from the absorber layer producing a Te-rich surface layer that promotes inter-diffusion with the contact layer)

In another embodiment of the present invention a thin film comprising tellurium metal, Te metal nanoparticles or sintered nanoparticles can be used as the interface layer(s). Te metal nanoparticles layers can be prepared by colloidal synthetic methods. Tellurium metal nanoparticles can be deposited prior to the absorber layer deposition to create a tellurium rich interface between the Group II-VI semiconductor absorber layer and the back metal electrode. Alternatively, thin (1 to 100 nm) layer(s) of elemental Te metal may be deposited. Nanoparticle interface layers can be chemically treated (for example by ligand exchange) to improve their electrical properties.

In another embodiment the invention contemplates an interface layer(s) comprising a ZnTe thin film directly on a substrate electrode material deposited using, for example, physical vapor deposition means. In this embodiment ZnTe also serves as a barrier to Cu diffusion during thermal processing when Cu is used in the device between the back metal electrode and the absorber layer. In another embodiment a ZnTe nanoparticle solution is deposited directly on a substrate electrode. The ZnTe may be deposited as a colloidal solution of ZnTe nanoparticles. By depositing thin (10-1500 nm) layer(s) of ZnTe directly on the substrate electrode prior to absorber layer deposition, one can improve the electrical contact to this electrode. Solutions of zinc telluride nanoparticles (ZnTe nanoparticles as used in this embodiment are particles that are colloidal in nature and form dispersions in a variety of solvents; in some forms, when quantum confined, they are also known as quantum dots), are used to deposit ZnTe layers of any thickness in the described range. Their synthesis has been reported in the literature, see *A Novel Chemical Route to ZnTe Semiconductor Nanorods* Yadong Li, Yi Ding, Zhaoyu Wang Advanced Materials 11(10), Pages 847-850 (1999), the contents of which is hereby incorporated by reference in its entirety. Because these materials are in solution form, they can be deposited on a substrate by printing techniques (inkjet printing, screen printing), spin coating, spray coating, wet- or die-coating techniques, etc. The solvent can be removed by a number of means including evaporative (ambient temperature or thermal) treatments, solution extraction, etc. In one embodiment of this invention undoped ZnTe is deposited at 400° C. or 500° C. or even higher to prepare ZnTe thin films that are stable to high temperature processing during CdTe deposition.

In another embodiment Cu doped ZnTe is used as the ohmic contact interface layer. Typically the amount of copper in the ZnTe is in the range of less than 1 percent to 10 atomic percent. Copper is known to diffuse into CdTe decreasing the absorption layer thickness, and thereby improving the electrical contact between these materials; although excessive Cu diffusion is detrimental to device performance. In either a superstrate or a substrate-configuration CdTe solar cell, the Cu-doped ZnTe can be deposited by using copper-doped ZnTe nanoparticles (or $Cu_xTe$ where $1 \leq x \leq 2$ nanoparticles only). Nanoparticles of this composition can be produced by exchanging limiting amounts of copper ions into preformed ZnTe nanoparticles using the reported ion-exchange method, *Cation Exchange Reactions in Ionic Nanocrystals* Dong Hee Son, Steven M. Hughes, Yadong Yin, A. Paul Alivisatos *Science* 5 Nov. 2004, Vol. 306, No. 5698, pp. 1009-1012, the contents of which are incorporated herein by reference.

Cu doped ZnTe thin films are readily prepared from copper doped ZnTe targets by using physical vapor deposition methods known in the art. In one embodiment the present invention contemplates copper doped ZnTe thin films deposited on the back metal electrode followed by undoped ZnTe thin films. In a superstrate configuration solar cell reported in the prior art the ZnTe and copper doped ZnTe films are deposited after depositing CdTe and do not undergo high temperature process above 300° C. According to the present invention the ZnTe and copper doped ZnTe are deposited prior to deposition of CdTe which is normally deposited at temperature in excess of 400° C. or 500° C. or even higher. In a substrate configuration ZnTe and copper doped ZnTe should withstand process temperatures in excess of 400° C. or 500° C. or even higher. A problem with the prior art is copper diffusion at high temperatures. In the present invention the copper content of ZnTe and the thickness of undoped ZnTe are adjusted to allow just enough copper diffusion into CdTe but prevent excess copper diffusion that will be harmful to device performance.

In another embodiment of the present invention Zn ions can be used to exchange for Cu in preformed $Cu_xTe$ where $1 \leq x \leq 2$ nanoparticles. Ideally, the amount of copper exchanged into the ZnTe nanoparticles is controlled in the range of less than 1 percent to 10 atomic percent. Alternatively, pure copper telluride nanoparticles can be mixed in solution in a desired ratio (less than 1 percent to 10 atomic percent) with pure zinc telluride nanoparticles, and deposited using one of the liquid deposition methods listed above. Optionally, the dried copper-doped ZnTe layer, or the copper telluride/zinc telluride mixture can be thermally treated to increase density or crystal grain size. Another option is to modify the contact surface by treating it with a Cu-containing material, for example: $Cu_xSe$, $CuCl_2$, $CuO$, $Cu_xS$, $Cu_xOH$, with subsequent thermal annealing, prior to absorber deposition.

In another embodiment of the present invention a thin $Cu_xTe$ where $1 \leq x \leq 2$ layer is deposited in between back metal and ZnTe thin film layer to control the amount of copper that ends up in the CdTe layer.

In another embodiment of the present invention an interface layer(s) of p-doped ZnTe is deposited in between the metal electrode layer and tellurium rich $Cd_xTe_y$ where $y > x$ (or Tellurium metal layer) to improve ohmic contact in a substrate configuration. Thin films, nanoparticles or sintered nanoparticles of undoped ZnTe can be used between p-doped ZnTe nanoparticle layer and tellurium rich $Cd_xTe_y$ where $y > x$ nanoparticle layer. Nanoparticle interface layers can be chemically treated (for example by ligand exchange) to improve their electrical properties. Nanoparticle interface layers can be sintered (in air, inert or reactive atmosphere or vacuum) to improve their electrical properties.

CdZnTe nanoparticles with various Cd:Zn ratios can be prepared using a colloidal synthesis process. They can be prepared as CdZnTe alloys or they can be prepared as core shell nanoparticles (CdTe core with ZnTe shell or ZnTe core with CdTe shell). For core-shell particles a thermal treatment step can be used to convert them into ternary CdZnTe. CdZnTe nanoparticles can be deposited before depositing an absorber layer comprising a Group II-VI semiconductor compound layer in a substrate configuration. Layers of p-doped ZnTe can be used in between metal layer and CdZnTe layer to improve ohmic contact in a substrate configuration. Thin films, nanoparticles or sintered nanoparticles of undoped ZnTe can be used between p-doped ZnTe nanoparticle layer and CdZnTe nanoparticle layer.

The chemical composition of CdZnTe can be varied by adjusting Cd:Zn ratio such that a gradient is formed starting with pure or substantially pure ZnTe and ending with pure or substantially pure CdTe next to the absorber layer. In another embodiment the interface layer comprises at least three layers, wherein a first interface layer comprises $Cd_{1-x}Zn_xTe$ nanoparticles that are sintered where $x=0$, a second interface layer comprises $Cd_{1-x}Zn_xTe$ nanoparticles that are sintered where $x=1$, and a third interface layer in between the first and second interface layer said layer comprising $Cd_{1-x}Zn_xTe$ nanoparticles that are sintered where $0 \leq x \leq 1$. It is preferred that in the third layer $x=1$.

Example 1

Substrate Solar Cell with Ohmic Contact Interface Layer

In an embodiment of the present invention depicted in FIG. 1, a substrate 100 is coated with a metal electrode 110 followed by an ohmic contact interface layer 120. Group II-VI absorber layer 130 is deposited on top of ohmic contact interface layer 120 followed by a window layer 140 and transparent conductor 150. Substrate 100 can be opaque metal foil (stainless steel, aluminum or copper), flexible transparent polymer film (such as polyimide) or rigid transparent glass (borosilicate or soda lime). The thickness of the substrate can be 25-250 microns for flexible metal foils, 10-100 microns for flexible polymer films or 1-5 mm for glass. Metal electrode 110 can be Mo, Ti, Ni, Al, Nb, W, Cr, and Cu as non-limiting examples. Preferred is Mo, Ti or Ni. The metal electrode layer thickness can range from 50 nm to 1,000 nm. The metal layer can be deposited by physical vapor deposition techniques known in the art. An ohmic contact interface layer 120 can be made of a thin film or nanoparticles (sintered or unsintered) comprising $Cu_xTe$ where $1 \leq x \leq 2$, ZnTe, p doped ZnTe, $Cd_x Te_y$ where $x \neq y$, Cu doped CdTe, CdZnTe, $Sb_2Te_3$, $Bi_2Te_3$ and Te metal. Nanoparticles can be deposited on metal layer 110 by well known wet coating methods such as spin coating, slot die coating, roll coating, spray coating, ink-jet printing etc. When using nanoparticles or sintered nanoparticles as the interface layer 120 thickness can be 1-1,000 nm, preferably between 10-100 nm. As non-limiting examples of Group II-VI materials in the absorber layer 130 there are CdTe, ZnTe and/or HgTe. This layer is about 1-10 micron thickness and can be deposited by methods known in the art such as close spaced sublimation, vapor transport deposition, etc. The absorber layer comprising a Group II-VI semiconductor compound 130 can be subjected to $CdCl_2$ treatment well known in the art to increase the grain size. Absorber layer 130 can be chemically etched by methods well known in the art. A window layer 140 of 50-200 nm is deposited on top of the absorber layer by the methods well known in the art such as chemical bath deposition, close space sublimation, vapor transport deposition, etc. For this invention CdS is preferred as a window material. Window layer 140 can be thermally treated (200-500° C. for 10-30 minutes) to improve the grain size and to achieve a good junction between the absorber 130 and the window layer 140. A transparent conductor layer 150 is deposited on top of window layer 140 to complete the solar cell. Transparent conductor layer can be 50-1,000 nm comprising ITO or ZnO or other known TCO material known in the art. The TCO may be deposited by physical vapor deposition methods well known in the art. ZnO layer can consist of a resistive intrinsic ZnO layer and a conductive metal (ex: aluminum) doped ZnO layer.

Example 2

Figure 2:
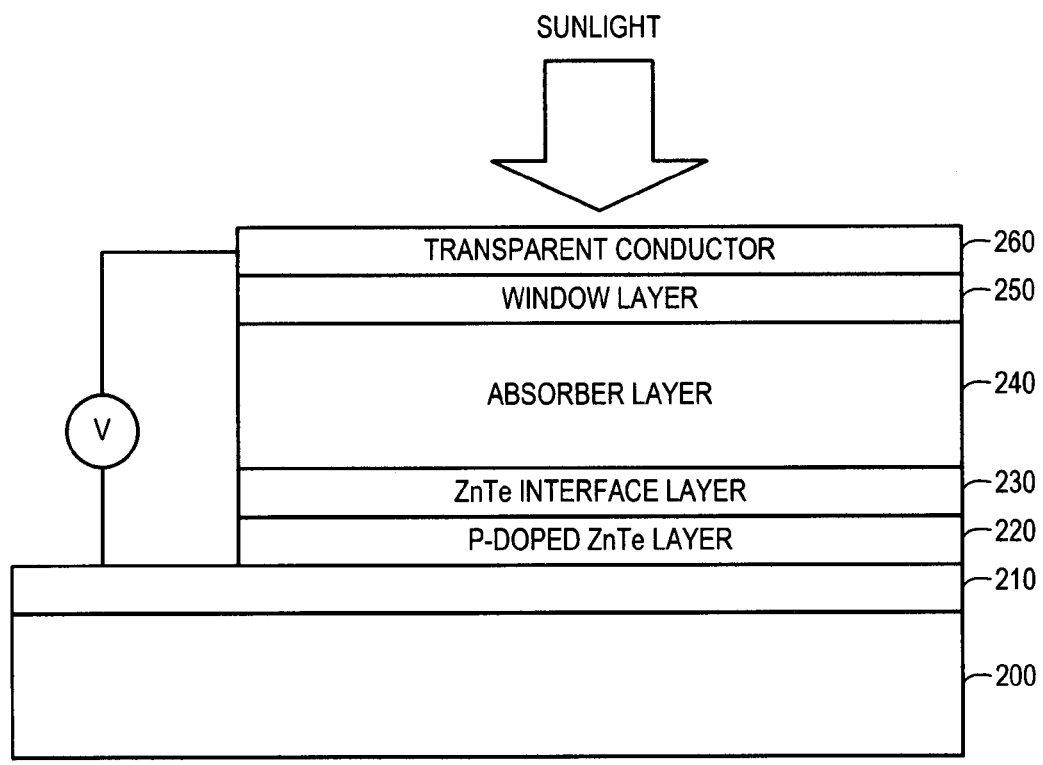
FIG. 2 shows a general schematic of a side view of one embodiment of the invention depicting a substrate configuration Group II-VI semiconductor solar cell with ZnTe and p-doped ZnTe interface layers.

Substrate Group II-VI semiconductor solar cell with ZnTe and p-doped ZnTe interface layers. In an embodiment of the present invention depicted in FIG. 2, a substrate 200 is coated with a metal electrode 210 followed by a p-doped ZnTe interface layer 220 and a ZnTe 230. Group II-VI absorber layer 240 is deposited on top of ZnTe interface layer 230 followed by a window layer 250 and transparent conductor 260. Substrate 200 can be opaque metal foil (for example stainless steel, aluminum or copper), a flexible transparent polymer film (such as polyimide) or a rigid transparent glass (such as borosilicate or soda lime). The p-doped ZnTe layer 220 can comprise copper doped ZnTe nanoparticles or sintered nanoparticles (sintered or un-sintered) or thin films. The p-doped ZnTe layer can also be obtained by a mixture of ZnTe and $Cu_xTe$ where $1 \leq x \leq 2$ nanoparticles. Copper content of p-doped ZnTe layer 220 is in the range of 1-10 atomic percent of Copper. Intrinsic undoped ZnTe interface layer 230 is deposited on top of the p-doped ZnTe layer 220. The Group II-VI material absorber layer 240 can be CdTe 1-10 microns thick which can be deposited by methods well known in the art such as close spaced sublimation, vapor transport deposition, etc. A window layer 150 of 50-200 nm is deposited on top of the CdTe layer by the methods well known in the art such as chemical bath deposition, close space sublimation, vapor transport deposition, etc. A transparent conductor layer 260 is deposited on top of window layer 250 to complete the solar cell.

Example 3

Figure 3:
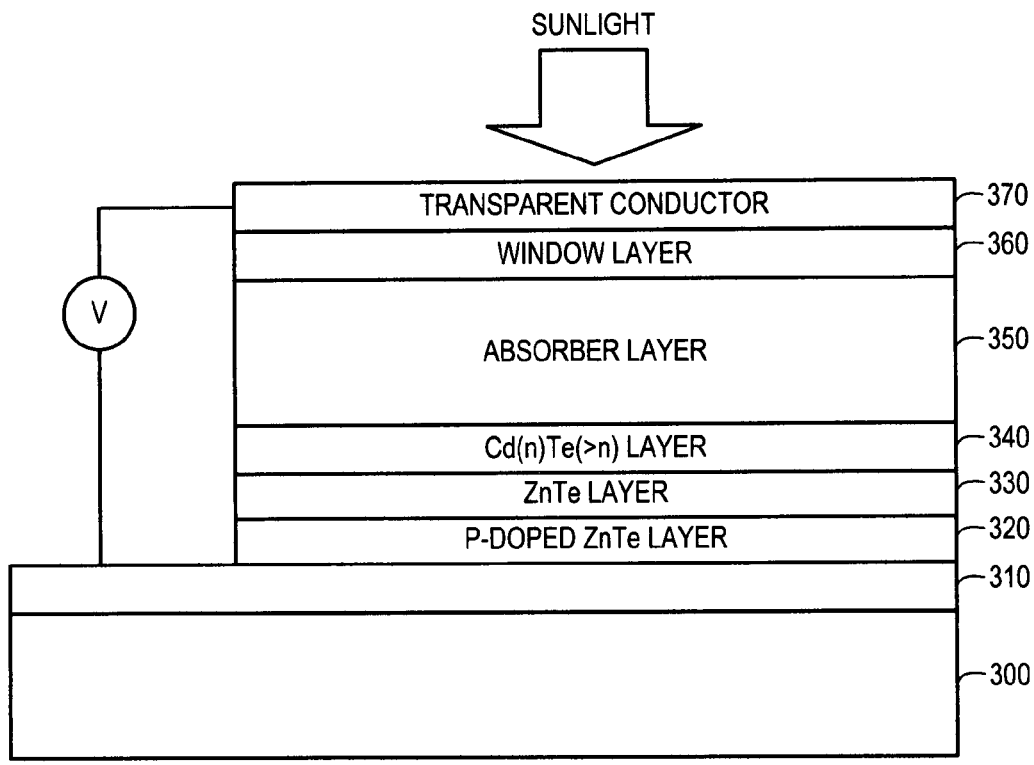
FIG. 3 shows a general schematic of a side view of one embodiment of the invention depicting a substrate CdTe solar cell with p-doped ZnTe, ZnTe and $Cd_xTe_y$ where y>x interface layers.

Substrate solar cell with p-doped ZnTe, ZnTe and $Cd_xTe_y$ where y>x interface layers. In an embodiment of the present invention depicted in FIG. 3, a substrate 300 is coated with a metal electrode 310 followed by a p-doped ZnTe interface layer 320, a ZnTe layer 330 and tellurium rich $Cd_xTe_y$ where y>x nanoparticle layer 340. Tellurium containing Group II-VI semiconductor absorber layer 350 is deposited on top of ZnTe interface layer 330 followed by a window layer 360 and transparent conductor 370. Substrate 300 can be opaque metal foil (stainless steel, aluminum or copper), flexible transparent polymer film (such as polyimide) or rigid transparent glass (borosilicate or soda lime). Thickness of the substrate 300 can be 25-250 microns for flexible metal foil, 10-100 microns for flexible polymer film or 1-5 mm for glass. Metal electrode 310 can be metals as disclosed herein. The metal electrode thickness can range from 50 nm to 1,000 nm. The p-doped ZnTe layer 320 can be copper doped ZnTe nanoparticles or sintered nanoparticles or thin films. The p-doped ZnTe nanoparticle layer 320 can also be obtained by a mixture of ZnTe and $Cu_xTe$ where $1 \leq x \leq 2$ nanoparticles. Copper content of p-doped ZnTe layer 320 is in the range of about 1-10 atomic percent of Copper. Tellurium rich $Cd_xTe_y$ where y>x nanoparticles or sintered nanoparticles are expected to improve back contact to CdTe much the same way as wet chemical etching of CdTe used in traditional superstrate CdTe solar cells improves back contact by creating tellurium rich interface. In a substrate configuration such chemical etching methods cannot be used because the CdTe/back metal interface is buried and not accessible. Tellurium rich nanoparticle layer $Cd_xTe_y$ where y>x used as proposed in this invention is novel and enables the tellurium rich interface at the buried CdTe back contact. Group II-VI absorber layer 350 can be CdTe of 1-10 micron thickness which can be deposited by methods known in the art such as close spaced sublimation, vapor transport deposition, etc. A window layer 360 of 50-200 nm is deposited on top of the CdTe layer by the methods known in the art such as chemical bath deposition, close space sublimation, vapor transport deposition, etc.

Example 4

Figure 4:
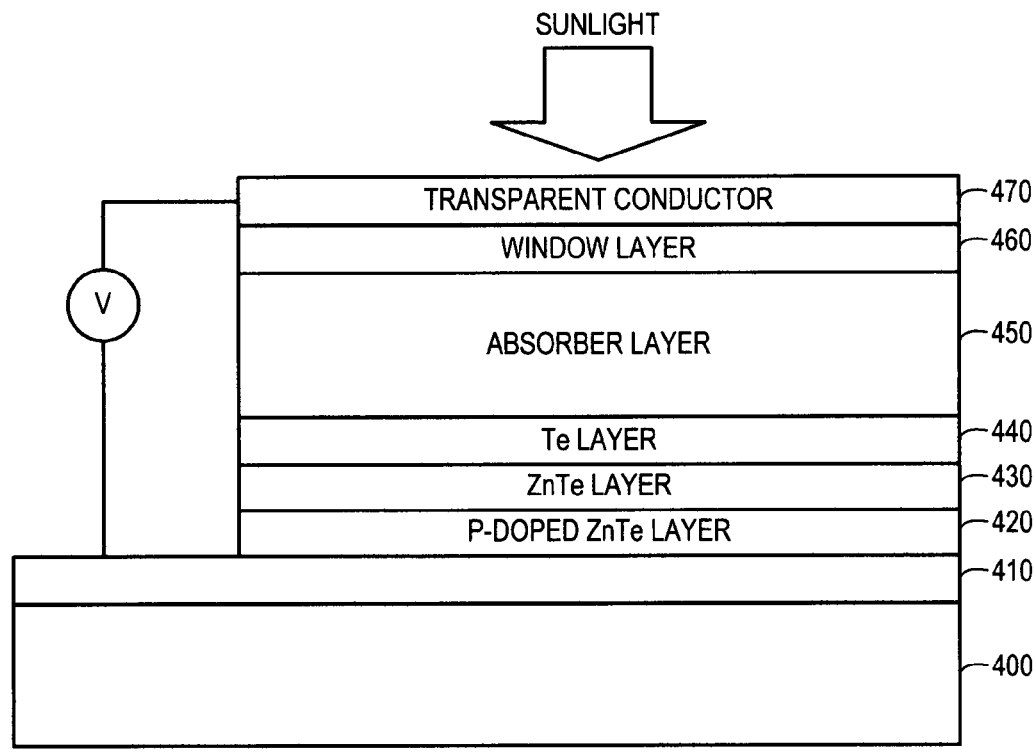
FIG. 4 shows a general schematic of a side view of one embodiment of the invention depicting a substrate CdTe solar cell with p-doped ZnTe, ZnTe and Te interface layers.

Substrate CdTe solar cell with p-doped ZnTe, ZnTe and Te interface layers. In an embodiment of the present invention depicted in FIG. 4, a substrate 400 is coated with a metal electrode 410 followed by a p-doped ZnTe interface layer 420, a ZnTe layer 430 and tellurium layer 440. The interface layers may comprise thin films or particles. Group II-VI semiconductor absorber layer 450 is deposited on top of ZnTe nanoparticle interface layer 430 followed by a window layer 460 and transparent conductor 470. Substrate 400 can be opaque metal foil (stainless steel, aluminum or copper), flexible transparent polymer film (such as polyimide) or rigid transparent glass (borosilicate or soda lime). The p-doped ZnTe layer 420 can be copper doped ZnTe nanoparticles or sintered nanoparticles. The p-doped ZnTe layer can also be obtained by a mixture of ZnTe and $Cu_xTe$ where $1 \leq x \leq 2$ nanoparticles or sintered nanoparticles. Copper content of p-doped ZnTe layer 420 is in the range of 1-10 atomic percent of Copper. Layers comprising nanoparticles or sintered nanoparticles 420, 430 and 440 have a thickness between 1-1,000 nm, preferably between 10-100 nm.

Example 5

Figure 5:
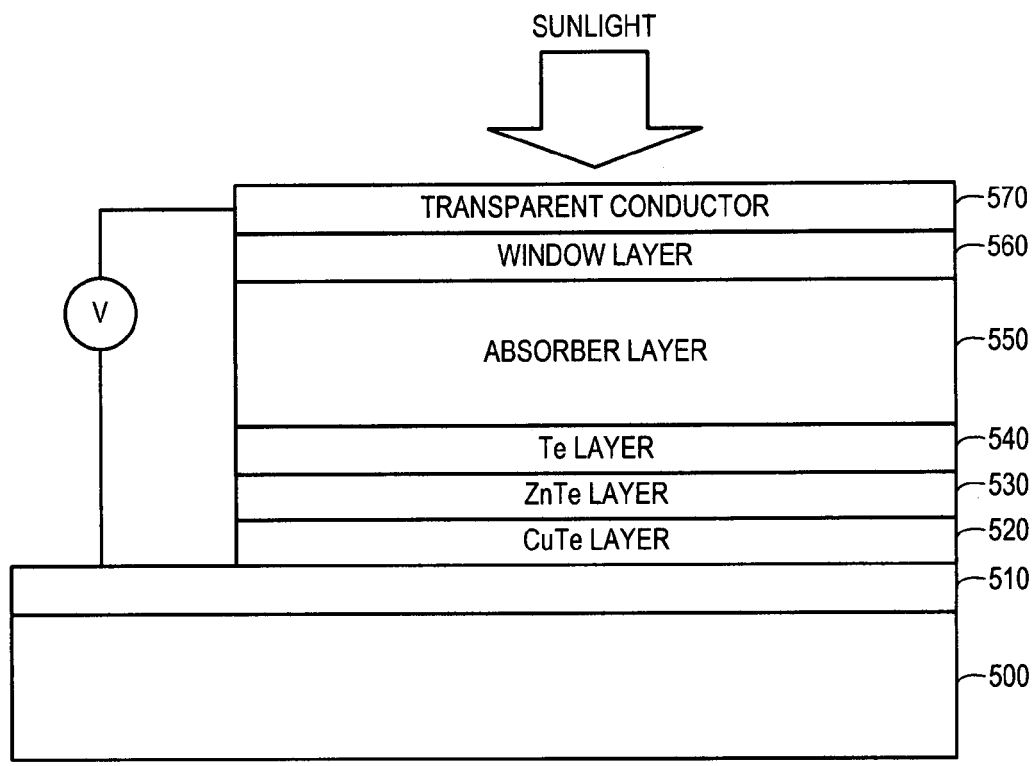
FIG. 5 shows a general schematic of a side view of one embodiment of the invention depicting a substrate CdTe solar cell with CuTe (which is $Cu_xTe$ where $1 \leq x \leq 2$), ZnTe and Te interface layers.

Substrate CdTe solar cell with $Cu_xTe$ where $1 \leq x \leq 2$, ZnTe and Te interface layers. In an embodiment of the present invention depicted in FIG. 5, a substrate 500 is coated with a metal electrode 510 followed by a $Cu_xTe$ where $1 \leq x \leq 2$ interface layer 520, a ZnTe layer 530 and a tellurium nanoparticle layer 540. Group II-VI absorber layer 550 is deposited on top of a Te interface layer 540 followed by a window layer 560 and transparent conductor 570. The p-type layer 520 can be $Cu_xTe$ where $1 \leq x \leq 2$ nanoparticles or sintered nanoparticles or thin film.

Example 6

Figure 6:
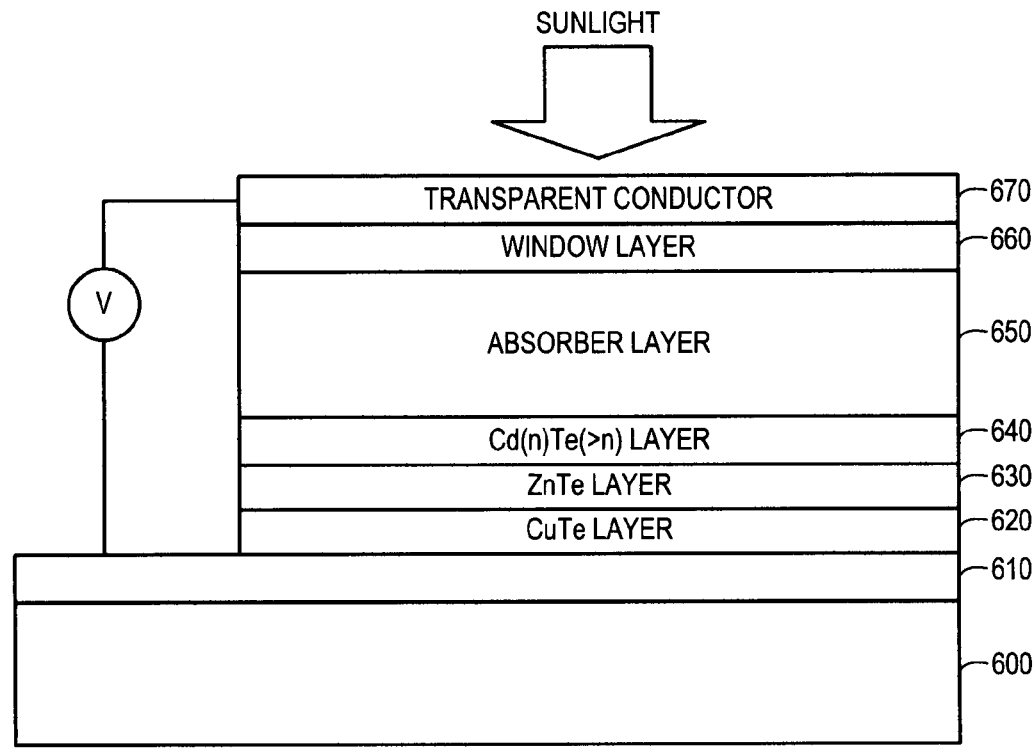
FIG. 6 shows a general schematic of a side view of one embodiment of the invention depicting a substrate CdTe solar cell with CuTe which is ($Cu_xTe$ where $1 \leq x \leq 2$), ZnTe and $Cd_xTe_y$ where y>x interface layers.

Substrate CdTe solar cell with $Cu_xTe$ where $1 \leq x \leq 2$, ZnTe and $Cd_xTe_y$ where x≠y interface layers. In an embodiment of the present invention depicted in FIG. 6, a substrate 600 is coated with a metal electrode 610 followed by a $Cu_xTe$ where $1 \leq x \leq 2$ interface layer 620, ZnTe layer 630 and tellurium rich $Cd_xTe_y$ where y>x layer 640. Tellurium containing II-VI absorber layer 650 is deposited on top tellurium rich $Cd_xTe_y$ where x≠y layer 640 followed by a window layer 660 and transparent conductor 670.

Example 7

Figure 7:
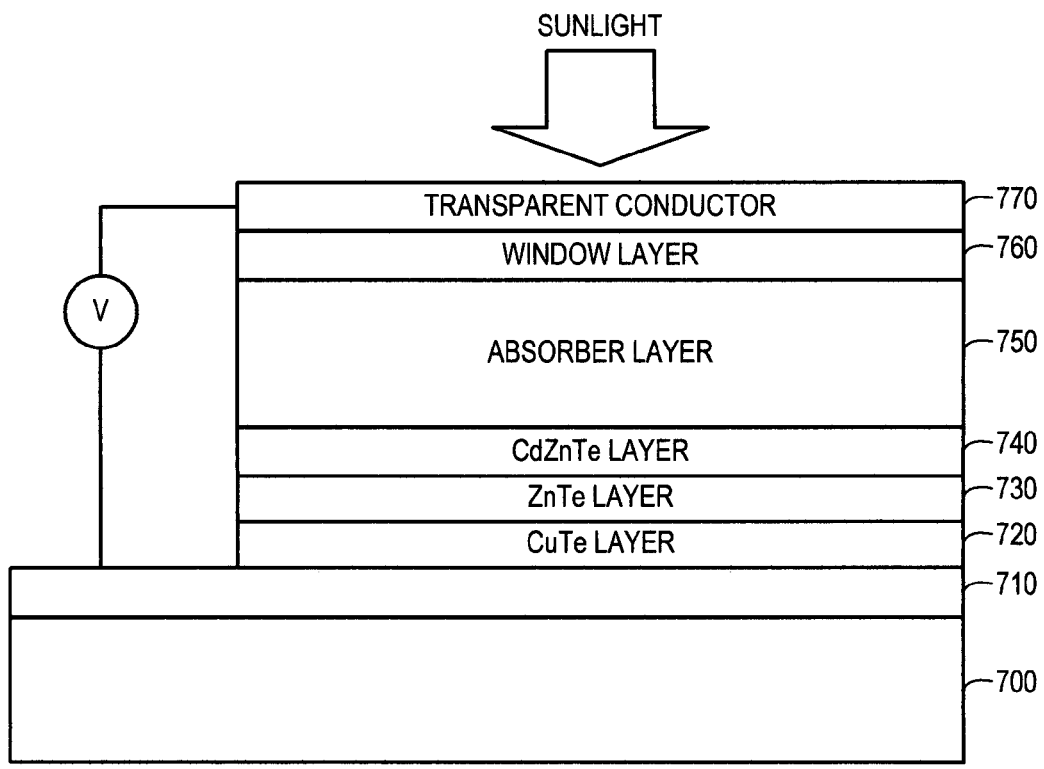
FIG. 7 shows a general schematic of a side view of one embodiment of the invention depicting a substrate solar cell with CuTe (which is $Cu_xTe$ where $1 \leq x \leq 2$), ZnTe and CdZnTe interface layers.

Substrate CdTe solar cell with $Cu_xTe$ where $1 \leq x \leq 2$, ZnTe and CdZnTe interface layers. In an embodiment of the present invention depicted in FIG. 7, a substrate 700 is coated with a metal electrode 710 followed by $Cu_xTe$ where $1 \leq x \leq 2$ interface layer 720, ZnTe layer 730 and CdZnTe layer 740. Group II-VI absorber layer 750 is deposited on top of the CdZnTe layer 740 followed by a window layer 760 and transparent conductor 770.

Example 8

Figure 8:
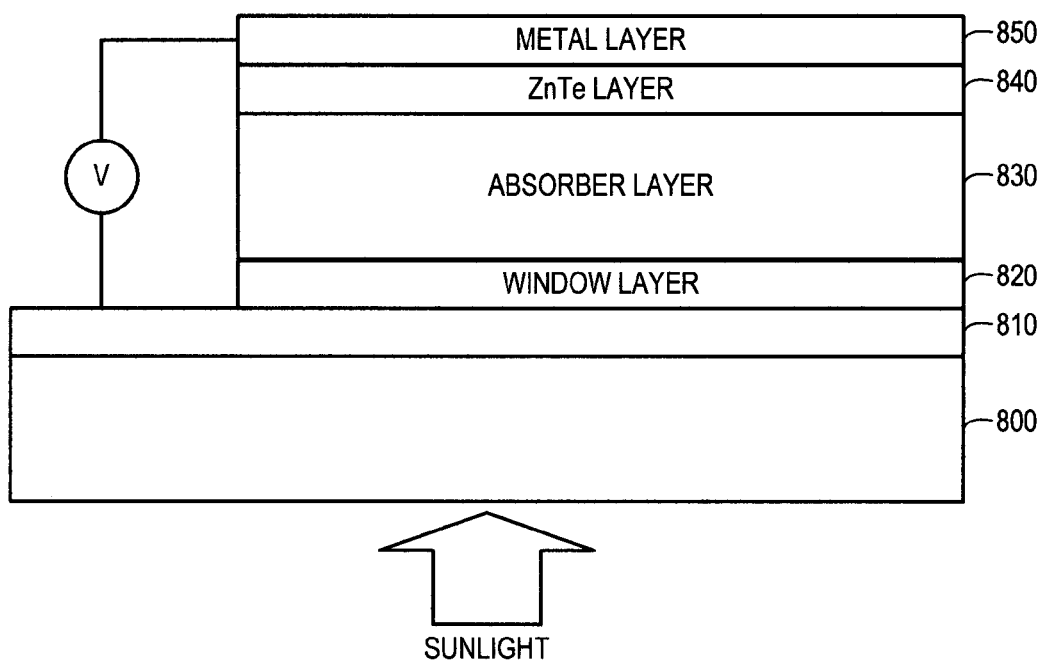
FIG. 8 shows a general schematic of a side view of one embodiment of the invention depicting a superstrate solar cell with an interface layer.

Superstrate solar cell with interface layer. In an embodiment of the present invention depicted in FIG. 8 a substrate 800 is coated with a transparent conducting electrode 810 followed by a window layer 820. Group II-VI absorber layer 830 is deposited on top of the window layer 820. An interface layer comprising nanoparticles or sintered nanoparticles 840 is deposited on top of the absorber layer 830 followed by metal electrode 850 layer to complete the solar cell.

Example 9

Figure 9:
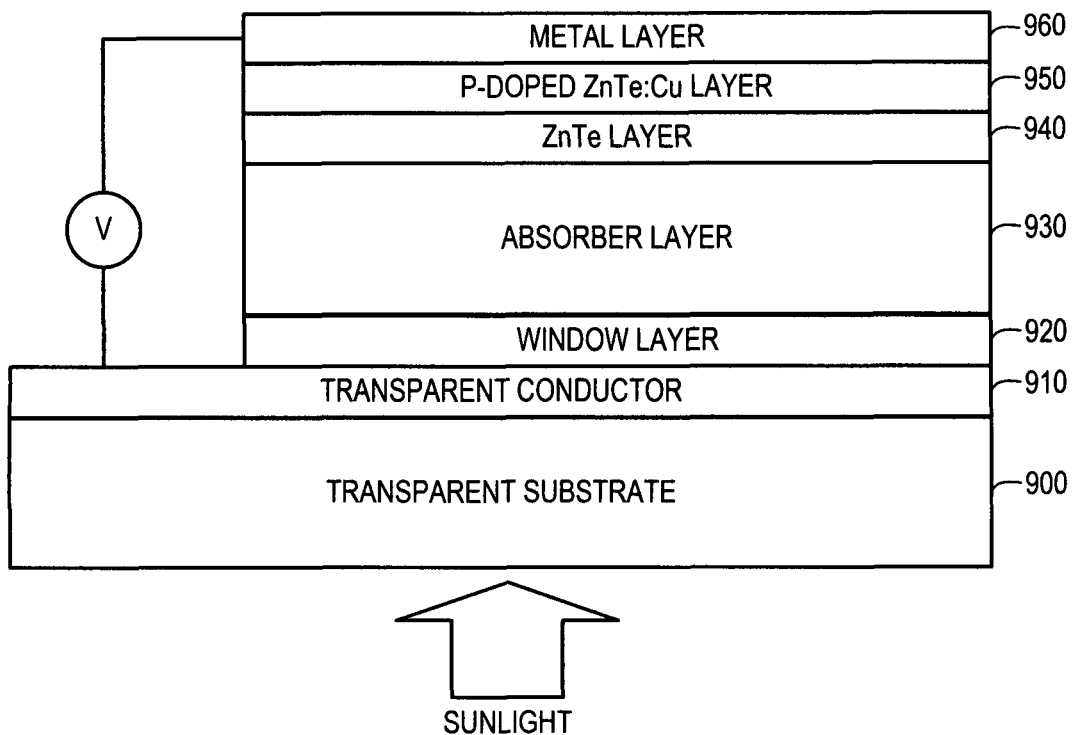
FIG. 9 shows a general schematic of a side view of one embodiment of the invention depicting a superstrate solar cell with ZnTe interface layers.

Superstrate solar cell with ZnTe interface layers. In an embodiment of the present invention depicted in FIG. 9 a transparent substrate 900 is coated with a transparent conducting electrode 910 followed by a window layer 920. Preferably the window layer comprises CdS. Group II-VI absorber layer 930 is deposited on top of window layer 920. A ZnTe interface layer 940 comprising nanoparticles or sintered nanoparticles is deposited on top of absorber layer 930 followed by a ZnTe:Cu nanoparticle layer 950 followed by metal electrode 960 layer to complete the solar cell.

Example 10

Figure 10:
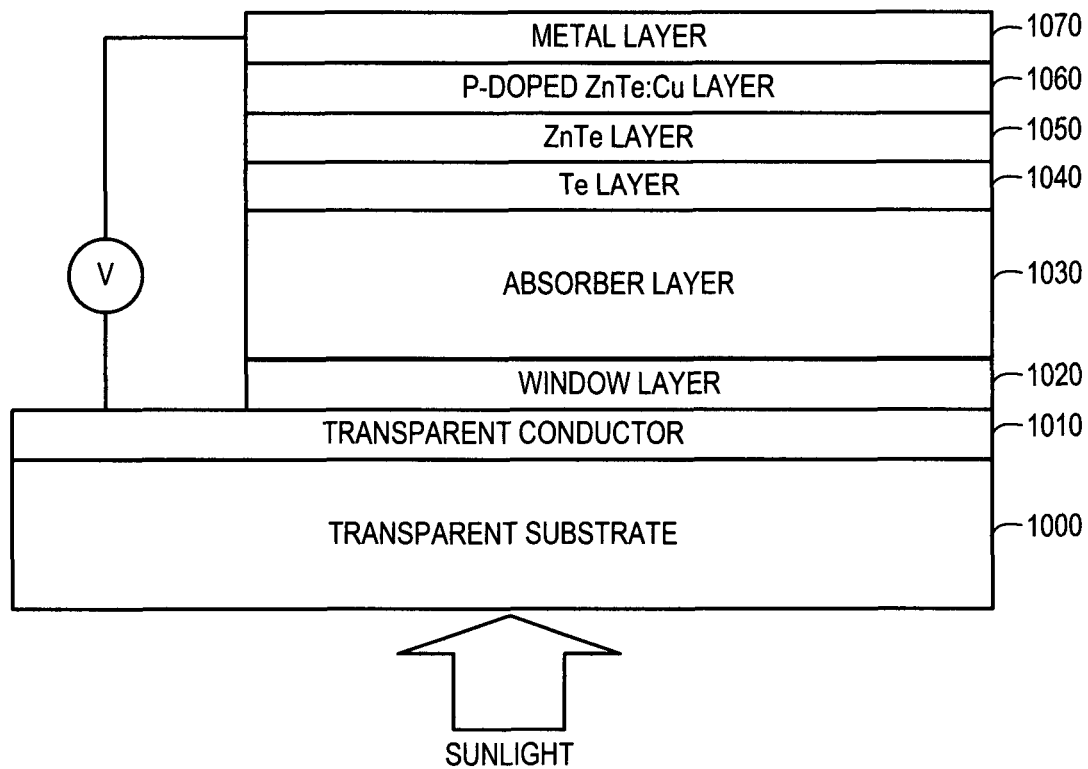
FIG. 10 shows a general schematic of a side view of one embodiment of the invention depicting a superstrate solar cell with ZnTe and Te interface layers.

Superstrate solar cell with ZnTe and Te interface layer. In an embodiment of the present invention depicted in FIG. 10 a substrate 1000 is coated with a transparent conducting electrode 1010 followed by window layer 1020. Group II-VI absorber layer 1030 is deposited on top of window layer 1020. A Te nanoparticle interface layer 1040 is deposited on top of absorber layer 1030 followed by an undoped ZnTe nanoparticle layer 1050 and a p-doped ZnTe:Cu nanoparticle layer 1060 and metal electrode 1070 layer to complete the solar cell.

Example 11

Figure 11:
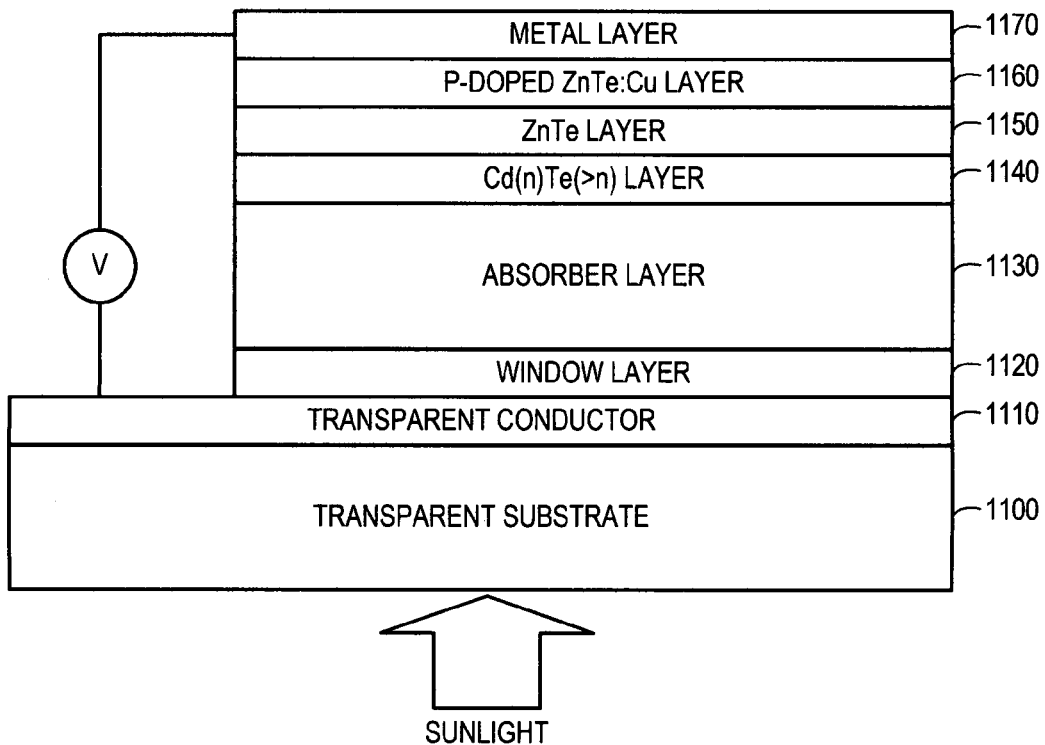
FIG. 11 shows a general schematic of a side view of one embodiment of the invention depicting a superstrate solar cell with ZnTe and $Cd_xTe_y$ where y>x interface layers.

Superstrate solar cell with ZnTe and $Cd_xTe_y$ where $x \neq y$ interface layers. In an embodiment of the present invention depicted in FIG. 11 a substrate 1100 is coated with a transparent conducting electrode 1110 followed by window layer 1120. Group II-VI absorber layer 1130 is deposited on top of window layer 1120. A Tellurium rich $Cd_xTe_y$ where $y>x$ interface layer 1140 is deposited on top of the absorber layer 1130 followed by an undoped ZnTe layer 1150 and a p-doped ZnTe:Cu layer 1160 and metal electrode 1170 layer to complete the solar cell. The interface layers in this embodiment comprise nanoparticles or sintered nanoparticles.

Example 12

Figure 12:
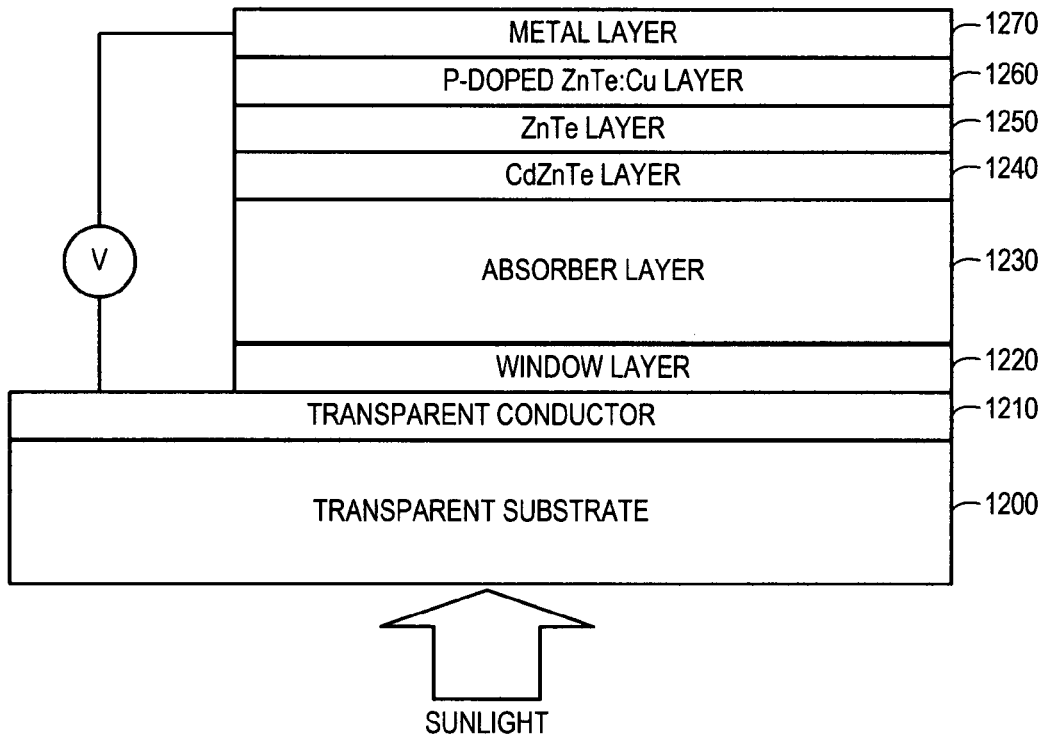
FIG. 12 shows a general schematic of a side view of one embodiment of the invention depicting a superstrate solar cell with ZnTe and CdZnTe interface layers.

Superstrate solar cell with ZnTe and CdZnTe interface layers. In an embodiment of the present invention depicted in FIG. 12 a substrate 1200 is coated with a transparent conducting electrode 1210 followed by window layer 1220. Group II-VI absorber layer 1230 is deposited on top of CdS window layer 1210. A CdZnTe interface layer 1240 is deposited on top of CdTe layer followed by an undoped ZnTe nanoparticle layer 1250 and a p-doped ZnTe:Cu layer 1260 and metal electrode 1270 layer to complete the solar cell. The interface layers in this embodiment comprise nanoparticles or sintered nanoparticles.

It is understood that the embodiments described herein disclose only illustrative but not exhaustive examples of the layered structures possible by the present invention. Intermediate and/or additional layers to those disclosed herein are also contemplated and within the scope of the present invention. Coating, sealing and other structural layers are contemplated where end use of the photovoltaic device warrants such construction.

All patents, publications and disclosures disclosed herein are hereby incorporated by reference in their entirety for all purposes.

What is claimed is:

1. A photovoltaic device having a substrate configuration, comprising:
   a substrate,
   said substrate being transparent or opaque,
   a metal electrode layer,
   a transparent conductor layer,
   an absorber layer,
   said absorber layer comprises a Group II-VI semiconductor compound,
   a window layer, and
   an interface layer, wherein
   the interface layer comprises nanoparticles and/or nanoparticles that are sintered and is disposed between the metal electrode layer and the absorber layer such that an ohmic contact is created between the metal electrode layer and the absorber layer.

2. A photovoltaic device according claim 1, wherein: said absorber layer comprises a CdTe semiconductor.

3. A photovoltaic device according claim 2, wherein: said window layer comprises a CdS semiconductor.

4. A photovoltaic device as claimed in claim 1, wherein: the interface layer comprises a plurality of layers, wherein: said plurality of layers comprises a layer comprising a thin film, and
said thin film comprises a material selected from the group consisting of Group II-VI compounds, Group IV-VI compounds, Group IV compounds, Group III-V compounds and Group I-III-VI compounds.

5. A photovoltaic device as claimed in claim 1, wherein: the nanoparticles and/or nanoparticles that are sintered each independently comprise a material selected from the group consisting of
Group II-VI compounds, Group IV-VI compounds, Group IV compounds, Group III-V compounds and Group I-III-VI compounds.

6. A photovoltaic device as claimed in claim 5, wherein: the nanoparticles and/or nanoparticles that are sintered independently comprise a material selected from the group consisting of $Cu_xTe$ where $1 \leq x \leq 2$, ZnTe, p doped ZnTe, $Cd_xTe_y$ where $x \neq y$, Cu doped CdTe, CdZnTe, $Sb_2Te_3$, $Bi_2Te_3$ and Te metal.

7. A photovoltaic device as claimed in claim 6, wherein: the nanoparticles and/or nanoparticles that are sintered independently comprise a material selected from the group consisting of $Cd_xTe_y$ where $y>x$ and Cu doped ZnTe.

8. A photovoltaic device as claimed in claim 1, wherein: the interface layer comprises a plurality of layers.

9. A photovoltaic device as claimed in claim 1, wherein: the interface layer comprises a plurality of layers, said plurality of layers comprising a first layer comprising p-doped ZnTe nanoparticles, and a second layer comprising ZnTe nanoparticles.

10. A photovoltaic device as claimed in claim 9, wherein: the interface layer further comprises a third layer comprising Te metal nanoparticles disposed between the second layer comprising ZnTe nanoparticles and the absorber layer.

11. A photovoltaic device as claimed in claim 1, wherein: said interface layer comprises a plurality of layers, said plurality of layers comprises a first layer comprising $Cu_xTe$ where $1 \leq x \leq 2$ nanoparticles, and a second layer comprising ZnTe nanoparticles.

12. A photovoltaic device as claimed in claim 11, wherein: the interface layer further comprises a third layer disposed between the second layer and the absorber layer, said third layer comprising a material selected from the group consisting of Te metal nanoparticles, $Cd_xTe_y$ where $x \neq y$ nanoparticles and CdZnTe nanoparticles.

13. A photovoltaic device as claimed in claim 1, wherein: the interface layer comprises at least three layers, wherein a first interface layer comprises $Cd_{1-x}Zn_xTe$ nanoparticles that are sintered where x=0, a second interface layer comprises $Cd_{1-x}Zn_xTe$ nanoparticles that are sintered where $x \neq 0$, and
a third interface layer in between the first and second interface layer said layer comprising $Cd_{1-x}Zn_xTe$ nanoparticles that are sintered where $0 \leq x \leq 1$.

14. A photovoltaic device as claimed in claim 1, wherein:
the interface layer comprises a plurality of layers,
said plurality of layers comprises a first layer comprising p-doped ZnTe nanoparticles that are sintered,
and a second layer comprising ZnTe nanoparticles that are sintered.

15. A photovoltaic device as claimed in claim 14, wherein:
the interface layer further comprises a third layer comprising Te metal nanoparticles that are sintered disposed between the second layer comprising ZnTe nanoparticles that are sintered and the absorber layer.

16. A photovoltaic device as claimed in claim 1, wherein:
said interface layer comprises a plurality of layers,
said plurality of layers comprises a first layer comprising $Cu_xTe$ where $1 \leq x \leq 2$ nanoparticles that are sintered, and
a second layer comprising ZnTe nanoparticles that are sintered.

17. A photovoltaic device as claimed in claim 16, wherein:
the interface layer further comprises a third layer disposed between the second layer and the absorber layer,
said third layer comprises a material selected from the group consisting of Te metal nanoparticles that are sintered, $Cd_xTe_y$ where $x \neq y$ nanoparticles that are sintered and CdZnTe nanoparticles that are sintered.

18. A photovoltaic device as claimed in claim 1, wherein:
the interface layer comprises at least three layers, wherein
a first interface layer comprises $Cd_{1-x}Zn_xTe$ nanoparticles that are sintered where $x=0$,
a second interface layer comprises $Cd_{1-x}Zn_xTe$ nanoparticles that are sintered where $x \neq 0$, and
a third interface layer in between the first and second interface layer said layer comprising $Cd_{1-x}Zn_xTe$ nanoparticles that are sintered where $0 \leq x \leq 1$.

19. A photovoltaic device as claimed in claim 4, wherein:
said thin film comprises a material selected from the group consisting of $Cu_xTe$ where $1 \leq x \leq 2$, ZnTe, p doped ZnTe, $Cd_xTe_y$ where $x \neq y$, Cu doped CdTe, CdZnTe, $Sb_2Te_3$, $Bi_2Te_3$ and Te metal.

20. A photovoltaic device as claimed in claim 19, wherein:
the interface layer comprises a Te metal thin film.

* * * * *